United States Patent
Sasaki et al.

(10) Patent No.: US 8,488,282 B2
(45) Date of Patent: Jul. 16, 2013

(54) MAGNETIC SENSOR, MAGNETIC DETECTOR, AND MAGNETIC HEAD

(75) Inventors: Tomoyuki Sasaki, Tokyo (JP); Tohru Oikawa, Tokyo (JP); Kiyoshi Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 222 days.

(21) Appl. No.: 13/017,935

(22) Filed: Jan. 31, 2011

(65) Prior Publication Data

US 2011/0205666 A1    Aug. 25, 2011

(30) Foreign Application Priority Data

Feb. 24, 2010 (JP) ................................ 2010-038854

(51) Int. Cl.
*G11B 5/33* (2006.01)

(52) U.S. Cl.
USPC ........................................ 360/313; 257/422

(58) Field of Classification Search
USPC ............. 360/324–324.12, 319, 313; 257/421, 257/422, 427
See application file for complete search history.

(56) References Cited

U.S. PATENT DOCUMENTS

| | | | |
|---|---|---|---|
| 6,665,152 B2 | 12/2003 | Nemoto | |
| 6,917,088 B2 * | 7/2005 | Takahashi et al. | 257/422 |
| 6,934,133 B2 * | 8/2005 | Hayakawa et al. | 360/324.2 |
| 7,064,649 B2 | 6/2006 | Schmollngruber et al. | |
| 7,140,094 B2 | 11/2006 | Nemoto | |
| 7,253,995 B2 * | 8/2007 | Takahashi et al. | 360/324.2 |
| 8,072,713 B2 | 12/2011 | Yamada et al. | |
| 8,243,400 B2 * | 8/2012 | Ishikawa et al. | 360/324.2 |
| 8,295,006 B2 * | 10/2012 | Sugano et al. | 360/112 |
| 2003/0123198 A1 | 7/2003 | Sugawara et al. | |
| 2003/0179510 A1 * | 9/2003 | Hayakawa | 360/324.1 |
| 2006/0103989 A1 * | 5/2006 | Hayakawa | 360/324.1 |
| 2007/0253116 A1 | 11/2007 | Takahashi | |
| 2009/0034131 A1 | 2/2009 | Yamada et al. | |
| 2010/0007995 A1 * | 1/2010 | Sasaki | 360/319 |
| 2011/0204886 A1 * | 8/2011 | Sasaki et al. | 324/244 |
| 2011/0244268 A1 * | 10/2011 | Sasaki | 428/812 |
| 2012/0038355 A1 * | 2/2012 | Sasaki et al. | 324/244 |
| 2012/0074510 A1 * | 3/2012 | Sasaki et al. | 257/422 |

FOREIGN PATENT DOCUMENTS

| | | |
|---|---|---|
| JP | A-07-296340 | 11/1995 |
| JP | A-2002-298312 | 10/2002 |
| JP | A-2003-069109 | 3/2003 |
| JP | A-2004-521513 | 7/2004 |
| JP | 2007-299467 | 11/2007 |
| JP | A-2009-037702 | 2/2009 |

OTHER PUBLICATIONS

Dash et al; Electrical creation of spin polarization in silicon at room temperature, *doi:10.1038/nature08570*, vol. 462, Nov. 26, 2009; pp. 491 to 494.

(Continued)

*Primary Examiner* — Will J Klimowicz
(74) *Attorney, Agent, or Firm* — Oliff & Berridge, PLC

(57) ABSTRACT

A magnetic sensor comprises a channel, a ferromagnetic body and first and second reference electrodes on the channel, a magnetic shield covering a part of the channel opposing the ferromagnetic body, and an insulating film disposed between the channel and the magnetic shield, while the magnetic shield has a through-hole extending toward the part of the channel opposing the ferromagnetic body.

11 Claims, 10 Drawing Sheets

OTHER PUBLICATIONS

Lou et al., "Electrical Detection of Spin Accumulation at a Ferromagnet-Semiconductor Interface," Physical Review Letters, vol. 96, May 5, 2006, pp. 176603-1 to 176603-4.

European Search Report issued in European Patent Application No. 11153309.7 dated Apr. 15, 2011.

Lou et al., "Electrical Detection of Spin Accumulation at a Ferromagnet-Semiconductor Interface," *Physical Review Letters*, 2006, vol. 96, pp. 176603-1 to 176603-4.

Tran et al., "Enhancement of the Spin Accumulation at the Interface Between a Spin-Polarized Tunnel Junction and a Semiconductor," *Physical Review Letters*, 2009, vol. 102, pp. 036601-1 to 036601-4.

Dash et al., "Electrical Creation of Spin Polarization in Silicon at Room Temperature," *Nature*, 2009, vol. 462, pp. 491-494.

Sasaki et al., "Comparison of Spin Signals in Silicon Between Nonlocal Four-Terminal and Three-Terminal Methods," *Applied Physics Letters*, 2011, vol. 98, pp. 012508-1 to 012508-3.

U.S. Appl. No. 13/175,382, filed in the name of Tomoyuki Sasaki et al. filed Jul. 1, 2011.

O.M.J. van't Erve, et al., "Electrical Injection and Detection of Spin-Polarized Carriers in Silicon in a Lateral Transport Geometry", Applied Physics Letters, US, vol. 91, Nov. 21, 2007, P212109-1-P212109-3.

\* cited by examiner

MAGNETIC SENSOR, MAGNETIC DETECTOR, AND MAGNETIC HEAD

BACKGROUND OF THE INVENTION

1. Field of the Invention

The present invention relates to a magnetic sensor, a magnetic detector, and a magnetic head.

2. Related Background Art

Various devices for detecting external magnetic fields have conventionally been known, examples of which include Hall effect devices, MI (Magneto Impedance) devices, MR (Magneto Resistive) devices, GMR (Giant Magneto Resistive) devices, TMR (Tunnel Magneto Resistive) devices, and spin accumulation devices (see Japanese Patent Application Laid-Open No. 2007-299467). Magnetic field detection devices of this type have been in use for HDD heads for detecting magnetic fields from minute areas, sensors for detecting the geomagnetic field, and the like.

SUMMARY OF THE INVENTION

For detecting magnetic fluxes from a smaller area, the magnetic field detection devices used for the HDD heads have been made finer. However, techniques for finely dividing the devices have been approaching their limits. On the other hand, finely dividing the devices has increased the device resistance, thereby hindering lower power consumption and higher speed operation. That is, there has been a trade-off between making magnetic fluxes from minute areas detectable and inhibiting the device resistance from increasing.

For solving the problem mentioned above, it is an object of the present invention to provide a magnetic sensor which can detect magnetic fluxes from minute areas and inhibit the device resistance from increasing.

For achieving the above-mentioned object, the magnetic sensor in accordance with the present invention comprises a channel, a ferromagnetic body and first and second reference electrodes on the channel, a magnetic shield covering a part of the channel opposing the ferromagnetic body, and an insulating film disposed between the channel and the magnetic shield, wherein the magnetic shield has a through-hole extending toward the part of the channel opposing the ferromagnetic body.

The ferromagnetic body functions not only as an injecting electrode for injecting spins into the channel but also as a receiving electrode for receiving the spins from the channel. The channel functions as a part accumulating the spins injected from the ferromagnetic body. In this magnetic sensor, the magnetic shield covering the part of the channel opposing the ferromagnetic body is provided with a through-hole extending toward the part of the channel opposing the ferromagnetic body. When an external magnetic field is applied to the channel through the through-hole, the spins accumulated in the channel rotate their direction about the axis of the applied magnetic field (so-called Hanle effect). When no external magnetic field is applied to the channel, on the other hand, the spins accumulate within the channel as they are without changing their direction within the channel. Therefore, a voltage output or resistance output in response to the external magnetic field can be read by electrically connecting one of a current supply and an output meter to the ferromagnetic body and first reference electrode and electrically connecting the other to the ferromagnetic body and second reference electrode, whereby a value corresponding to the degree of rotation of spins depending on whether the external magnetic field exists or not can be detected. Hence, magnetic fluxes can be detected from a minute area corresponding to the size of the above-mentioned through-hole. Here, the magnetic fluxes can be detected without making the size of the ferromagnetic body smaller, whereby the device resistance can be inhibited from being increased by finely dividing the ferromagnetic body. Since the insulating film is disposed between the channel and the magnetic shield, the magnetic shield can be inhibited from absorbing the spins.

Preferably, an axial direction of the through-hole is nonparallel to a direction of magnetization of the ferromagnetic body.

When an external magnetic field is applied to the channel through the through-hole, spins within the channel rotate their direction about the axis of the applied magnetic field as mentioned above. If the axial direction of the through-hole and the direction of magnetization of the ferromagnetic body are parallel to each other, the spins will not rotate their direction in response to the external magnetic flux applied thereto, thus making it hard to detect magnetic fluxes. Hence, such magnetic fluxes can favorably be detected when the axial direction of the through-hole and the direction of magnetization of the ferromagnetic body are nonparallel to each other.

Preferably, the through-hole has a whole cross section opposing the channel as seen from the axial direction of the through-hole. In this case, external magnetic fields can be read more accurately from desirable areas.

The through-hole may have a bottom part having a diameter smaller than that of a top part thereof. That is, the through-hole may have a tapered side face. In this case, magnetic fluxes caused by external magnetic fields cannot be absorbed by the magnetic shield when obliquely incident on the channel. Therefore, the angle of incidence of external magnetic fields can be changed according to the taper angle of the tapered side face.

Preferably, the channel has a bent form, and the through-hole is disposed so as to oppose an outer side face of a bend of the channel. In this case, an area for reading magnetic fluxes of external magnetic fields and the like can be made compact.

Preferably, the ferromagnetic body has a direction of magnetization pinned by an antiferromagnetic body disposed on the ferromagnetic body.

When the ferromagnetic body is exchange-coupled with an antiferromagnetic body, the direction of magnetization of the ferromagnetic body can be provided with unidirectional anisotropy. This can yield the ferromagnetic body having a higher coercive force in one direction than when no antiferromagnetic body is provided.

Preferably, the magnetic sensor further comprises a permanent magnet for supplying the through-hole with a magnetic field oriented in the axial direction of the through-hole. In the case where no magnetic field is applied to a channel layer by the permanent magnet, an output peak appears when the external magnetic field to be inspected is zero. When the magnetic field is applied to the channel layer by the permanent magnet, by contrast, the output peak position can be shifted, so that an output peak can be generated when the external magnetic field is not zero.

Preferably, the ferromagnetic body is made of a metal selected from the group consisting of Cr, Mn, Co, Fe, and Ni, an alloy containing at least one element selected from the group, or a compound containing at least one element selected from the group and at least one element selected from the group consisting of B, C, N, Si, and Ge. They are ferromagnetic materials with high spin polarizability and thus can favorably achieve a function as a spin-injecting or spin-receiving electrode.

Preferably, the channel is made of a semiconductor containing at least one of Si, Ge, GaAs, C, and ZnO. Such a semiconductor has a relatively large spin-diffusion length, whereby spins can favorably be accumulated within the channel.

Preferably, a barrier layer is formed between the ferromagnetic body and the channel. This makes it possible for a large number of spin-polarized electrons to be injected from the ferromagnetic body into the channel, whereby the potential output of the magnetic sensor can be enhanced.

Preferably, a magnetic detector comprises a plurality of such magnetic sensors. In this case, respective outputs of the magnetic sensors can be combined. Such a magnetic detector can be employed in a biosensor for detecting cancer cells and the like, for example.

A magnetic head may comprise a reading head part having the above-mentioned magnetic sensor and a recording head part for writing. This can provide a new magnetic head utilizing the so-called Hanle effect.

The present invention can provide a magnetic sensor which can detect magnetic fluxes from minute areas and inhibit the device resistance from increasing.

DESCRIPTION OF THE PREFERRED EMBODIMENTS

Figure 1:
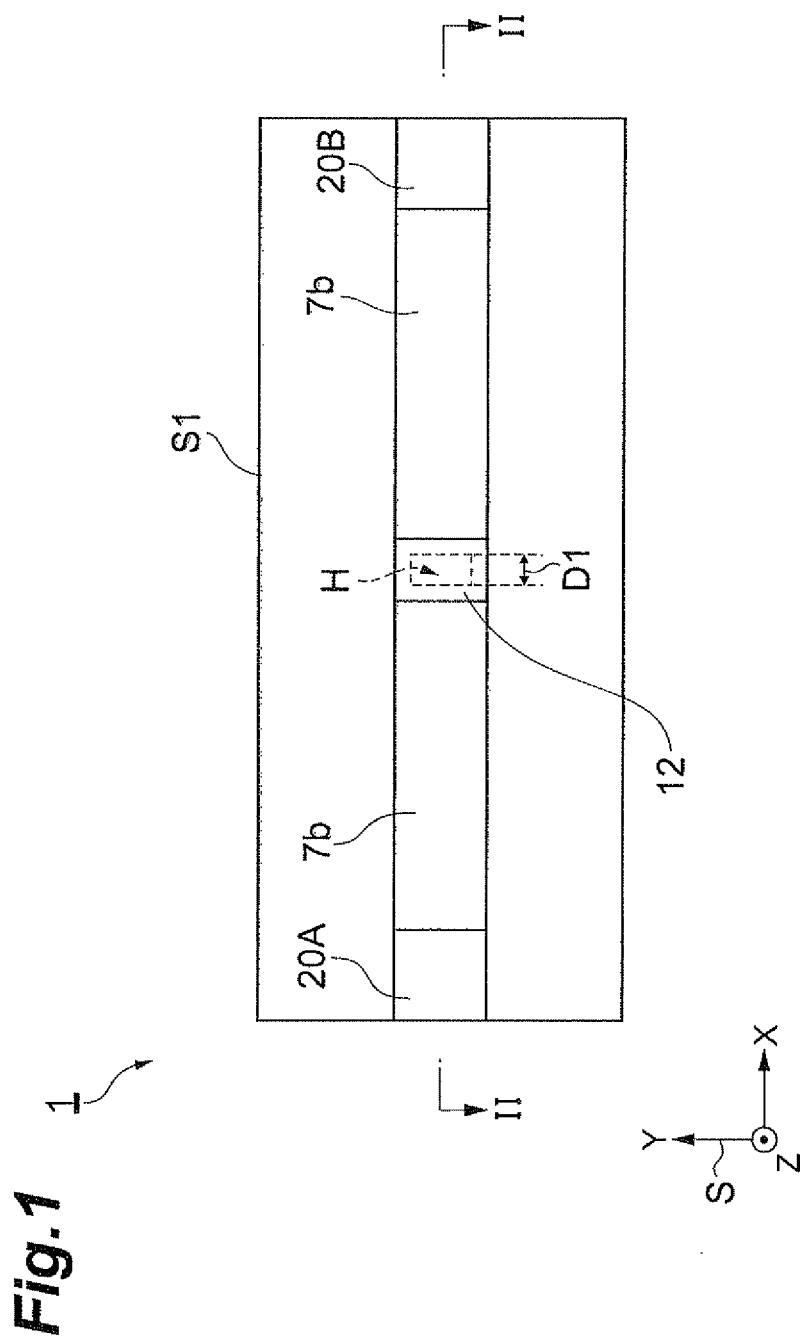
FIG. 1 is a top plan view of a magnetic sensor.

In the following, preferred embodiments of the magnetic sensor in accordance with the present invention will be explained in detail with reference to the drawings. An XYZ orthogonal coordination system is illustrated in the drawings.

Figure 2:
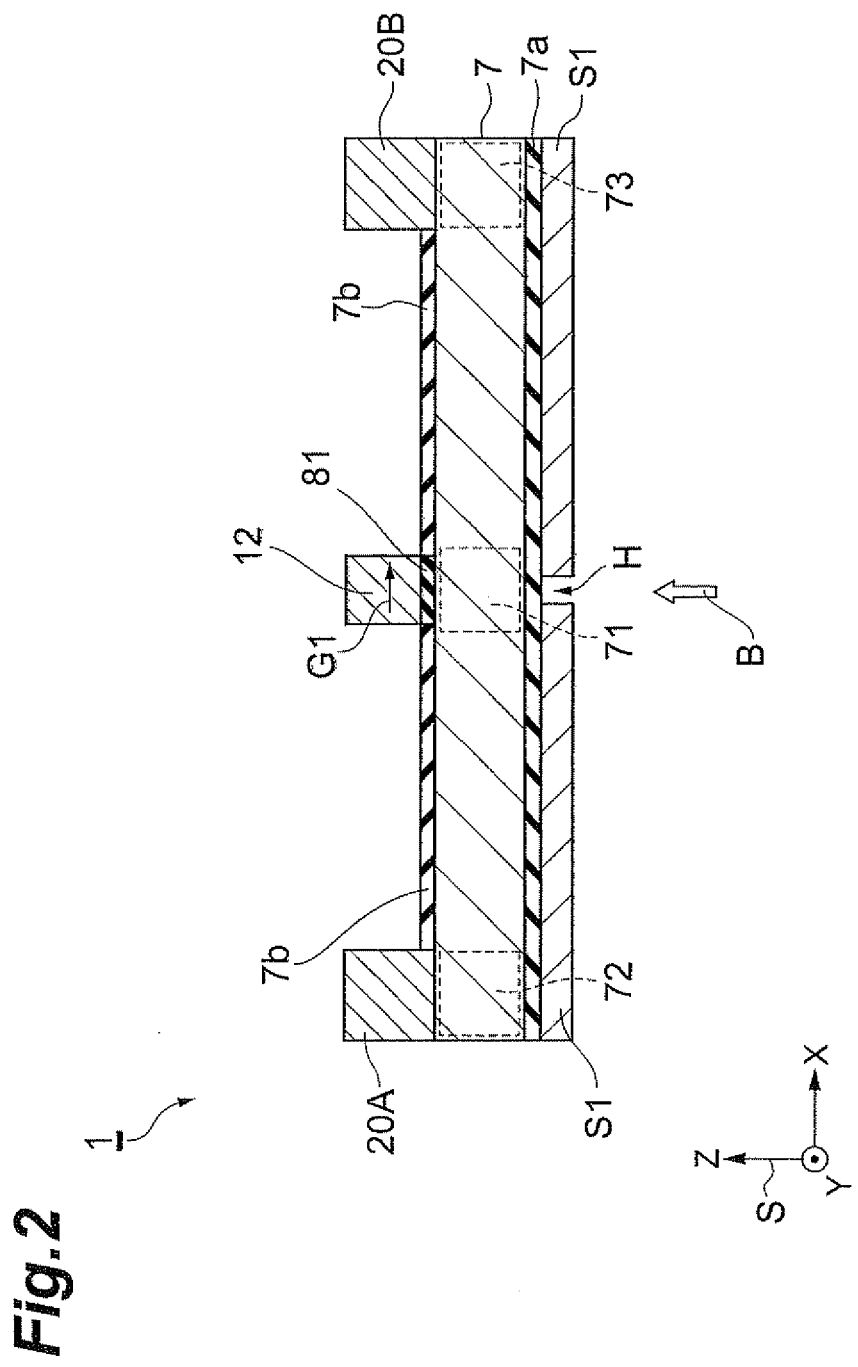
FIG. 2 is a sectional view taken along the line of FIG. 1.

FIG. 1 is a top plan view of the magnetic sensor in accordance with the first embodiment. FIG. 2 is a sectional view taken along the line II-II of FIG. 1.

As illustrated in FIG. 2, a magnetic sensor 1 comprises a channel layer 7, a ferromagnetic layer 12, and a magnetic shield layer and detects external magnetic fields along the Z axis.

The channel layer 7 functions as a part accumulating spins injected from the ferromagnetic layer 12. In the example illustrated in FIG. 1, the channel layer 7 has a rectangular form as seen from the thickness direction of the channel layer 7. The channel layer 7 may be doped with ions for rendering it electrically conductive. The ion content may be $1.0 \times 10^{15}$ to $1.0 \times 10^{22}$ cm$^{-3}$, for example. Preferably, the channel layer 7 is made of a material having a long spin life, an example of which is a semiconductor containing at least one of Si, Ge, GaAs, C, and ZnO.

The ferromagnetic layer 12 functions not only as an injecting electrode for injecting spins into the channel layer 7 but also as a receiving electrode for detecting the spins within the channel layer. The ferromagnetic layer 12 is disposed on a first region 71 of the channel layer 7. The ferromagnetic layer 12 has a rectangular parallelepiped form whose longer axis is oriented in the Y axis. Preferably, as illustrated in FIG. 2, the direction of magnetization G1 of the ferromagnetic layer 12 is nonparallel to the direction of magnetization B of an external magnetic field B. The ferromagnetic layer 12 is made of a ferromagnetic material. The ferromagnetic layer 12 may be made of a metal selected from the group consisting of Cr, Mn, Co, Fe, and Ni, an alloy containing at least one element selected from the group, or a compound containing at least one element selected from the group and at least one element selected from the group consisting of B, C, N, Si, and Ge, for example.

The magnetic shield layer covers a part of the channel layer 7 opposing the ferromagnetic layer 12. The magnetic shield layer covers the surface of the channel layer 7 at least partly while interposing an insulating film (e.g., insulating film 7a) therebetween, thereby blocking external magnetic fields from entering the channel layer 7. In particular, the magnetic shield layer covers a part about the first region 71 which opposes the ferromagnetic layer 12. The example illustrated in FIG. 2 uses a lower magnetic shield layer S1 as the magnetic shield layer. The lower magnetic shield layer S1 is disposed under the channel layer 7.

The magnetic shield layer has a through-hole H extending toward the part of the channel layer 7 opposing the ferromagnetic layer 12. The through-hole H is used for applying an external magnetic field to the channel layer 7. In the example illustrated in FIG. 2, the through-hole H is formed in the lower magnetic shield layer S1 and arranged so as to oppose the lower face of the first region 71 of the channel layer 7.

Preferably, as seen from the axial direction of the through-hole H (e.g., the Z axis in the example of FIG. 1), the whole cross section of the through-hole H opposes the channel layer 7. That is, the through-hole H is kept from extending off from the channel layer 7 as seen from the axial direction of the through-hole H. This makes it possible to read external magnetic fields more accurately.

Figure 4:
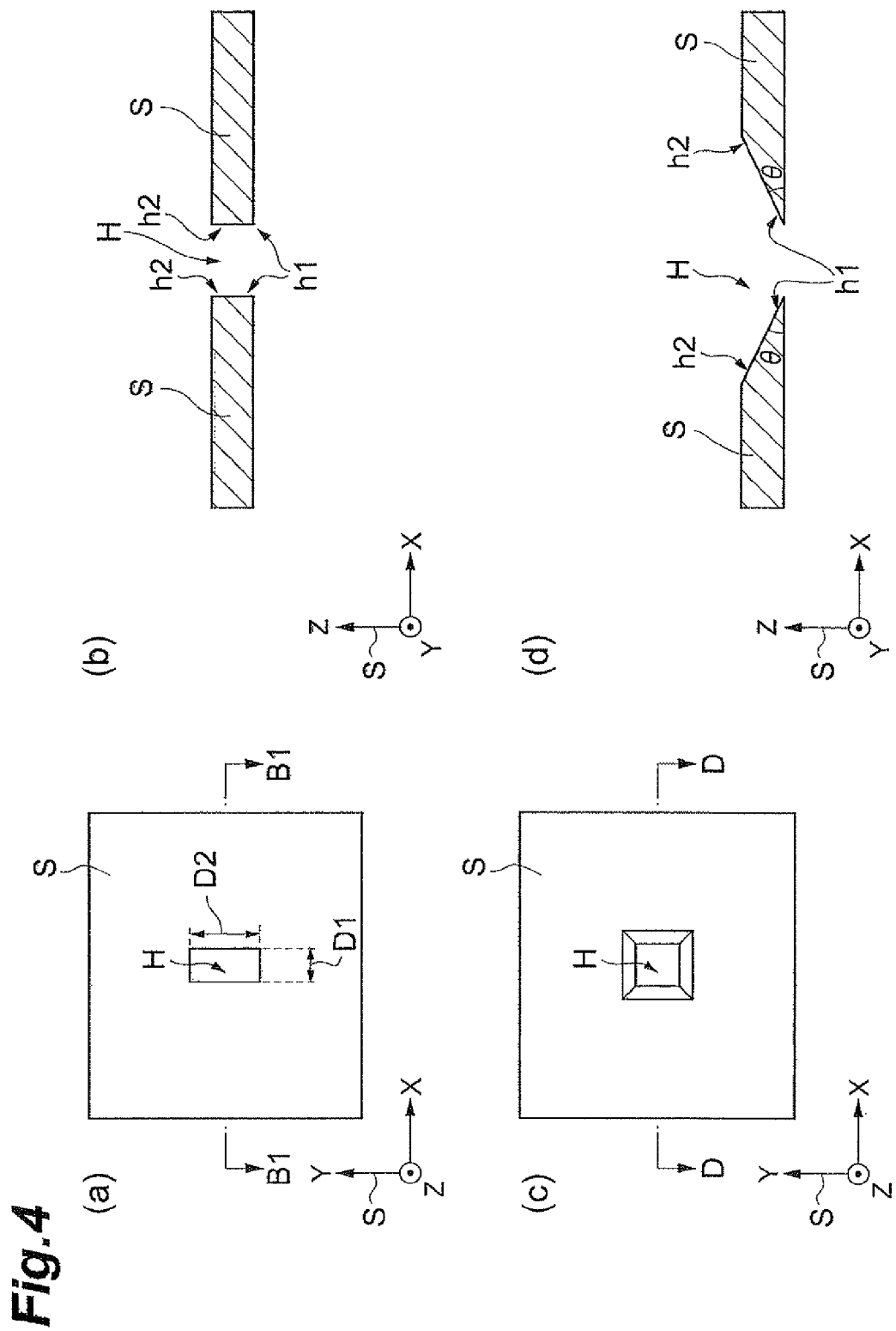
FIG. 4(a) is a top plan view illustrating an example of a through-hole formed in a magnetic shield layer.
FIG. 4(b) is a sectional view taken along the line B1-B1 of FIG. 4(a)
FIG. 4(c) is a top plan view illustrating an example of the through-hole formed in the magnetic shield layer.
FIG. 4(d) is a sectional view taken along the line D-D of FIG. 4(c)

FIG. 4(a) is a top plan view illustrating an example of the through-hole H formed in the magnetic shield layer S. As seen from the thickness direction of the magnetic shield layer S (the Z axis), the through-hole H can attain various forms, an example of which is a rectangle. In the example illustrated in FIG. 4(a), the through-hole H has an oblong form as seen from the thickness direction of the magnetic shield layer S (the Z axis). In this case, letting the shorter-side length (X-axis length) D1 of the through-hole H be 0.003 to 0.3 μm, for example, its longer-side length (Y-axis length) D2 may be 0.01 to 1 μm, for example.

FIG. 4(b) is a sectional view taken along the line B1-B1 of FIG. 4(a). As illustrated in FIG. 4(b), the bottom part h1 of the through-hole H may have a size identical to that of its top part h2. In this case, the through-hole H extends vertically toward the channel layer 7.

Examples of the material for the magnetic shield layer include soft magnetic materials such as alloys containing Ni and Fe, sendust, alloys containing Fe and Co, and alloys containing Fe, Co, and Ni.

The magnetic sensor 1 further comprises a first reference electrode 20A and a second reference electrode 20B. The first reference electrode 20A is disposed on a second region 72 of the channel layer 7. The second reference electrode 20B is disposed on a third region 73 of the channel layer 7. Each of the first and second reference electrodes 20A, 20B is made of an electrically conductive material, which is constituted by a nonmagnetic metal, such as Al, having a resistance lower than that of Si. As illustrated in FIG. 2, the first region 71 exists between the second and third regions 72, 73 of the channel layer 7. That is, the first reference electrode 20A, ferromagnetic layer 12, and second reference electrode 20B are arranged in this order with predetermined gaps along the X axis on the channel layer 7.

The distance between the first reference electrode 20A and the ferromagnetic layer 12 is longer than the spin-diffusion length by which electrons can keep their spins in the channel layer 7. The distance between the second reference electrode 20B and the ferromagnetic layer 12 is also longer than the spin-diffusion length in the channel layer 7. This structure can inhibit the first and second reference electrodes 20A, 20B from absorbing spins and lowering output. When the channel layer 7 is made of Si, the spin-diffusion length is about 2.5 µm, for example.

The magnetic sensor 1 further comprises a barrier layer 81. The barrier layer 81 is disposed between the channel layer 7 and the ferromagnetic layer 12. This makes it possible for a large number of spin-polarized electrons to be injected from the ferromagnetic layer 12 into the channel layer 7, whereby the potential output of the magnetic sensor can be enhanced. For example, the barrier layer 81 is a tunnel barrier made of a film of an insulating material. The barrier layer 81 is constituted by a single layer in the example illustrated in FIG. 2 but may have a multilayer structure constructed by a plurality of layers. For example, layers made of magnesium oxide, aluminum oxide, titanium oxide, zinc oxide, and beryllium oxide may be used as the barrier layer 81. Preferably, from the viewpoint of making it function as a tunnel insulating layer by inhibiting the resistance from increasing, the barrier layer 81 has a thickness of 3 nm or less. Preferably, in view of one atomic layer thickness, the barrier layer 81 has a thickness of 0.4 nm or more.

The magnetic sensor 1 further comprises an insulating film (or insulator). The insulating film functions to prevent the channel layer 7 from being exposed and insulate the channel layer 7 electrically and magnetically. Preferably, the insulating film exists between the magnetic shield layer and the channel layer 7. This is effective in inhibiting the spin flow flowing through the channel layer 7 from flowing out to the magnetic shield layer in particular. Preferably, the insulating film covers a necessary region on a surface (e.g., a lower, side, or upper face) of the channel layer 7. In the example illustrated in FIG. 2, insulating films 7a, 7b are disposed on the lower and upper faces of the channel layer 7, respectively. Specifically, the insulating film 7b is arranged on the upper face of the region existing between the second and third regions 72, 73. Leads connecting with the first reference electrode 20A, ferromagnetic layer 12, and second reference electrode 20B can be restrained from absorbing spins of the channel layer 7 when arranged on the insulating film 7b. When the leads are placed on the insulating film 7b, currents can also be kept from flowing from the leads to the channel layer 7.

When the insulating film exists, the lower magnetic shield layer S1 is disposed on the lower face of the channel layer 7 with the insulating film 7a interposed therebetween.

An example of a method for manufacturing the magnetic sensor 1 in accordance with this embodiment will now be explained. First, alignment marks are formed on a substrate prepared beforehand. As a substrate, an AlTiC substrate may be used, for example. With reference to the alignment marks, the lower magnetic shield layer S1 is formed on the substrate. Subsequently, the insulating film 7a is formed on the lower magnetic shield layer S1 by molecular beam epitaxy (MBE), for example.

Next, the channel layer 7 is formed on the insulating film 7a by MBE, for example. Ions for rendering the channel layer 7 electrically conductive are injected therein, so as to adjust the conductive characteristic of the channel layer 7. Thereafter, the ions are diffused by thermal annealing when necessary. Subsequently, attached substances, organic matters, and oxide films are washed away from the surface of the channel layer 7. For example, a diluted HF solution is used as a washing liquid.

Thereafter, a barrier film to become the barrier layer 81 and a ferromagnetic film to become the ferromagnetic layer 12 are formed in this order on the channel layer 7 by MBE, for example. An antiferromagnetic layer may further be formed on the ferromagnetic layer 12 by MBE, for example, when necessary. Subsequently, annealing under a magnetic field is carried out in order to pin the direction of magnetization of the ferromagnetic layer 1. Then, the barrier film and ferromagnetic film are processed through a mask by an electron beam (EB) method, for example. This forms the ferromagnetic layer 12 on the barrier layer 81 on the first second region 71 of the channel layer 7. Thereafter, unnecessary barrier and ferromagnetic films formed on the channel layer 7 are removed by ion milling, for example.

Next, the insulating film 7b is formed on the channel layer 7 free of the unnecessary barrier and ferromagnetic films. Also, the insulating film 7b is removed from the second and third regions 72, 73 of the channel layer 7, and the first and second reference electrodes 20A, 20B are formed there, respectively. The first and second reference electrodes 20A, 20B are formed by Al, for example.

Also, the lower magnetic shield layer S1 is formed so as to cover the part (i.e., the first region 71) of the channel layer 7 opposing the ferromagnetic layer 12 while interposing the insulating film 7a therebetween. In the example illustrated in FIG. 2, the lower magnetic shield layer S1 is formed so as to cover regions adjacent to the first region 71 of the channel layer 7 as well. Then, the lower magnetic shield layer S1 is provided with the through-hole H for magnetic fluxes from external magnetic fields to enter. The through-hole H can be formed by photolithography, for example. The foregoing method can produce the magnetic sensor 1 illustrated in FIGS. 1 and 2.

Figure 3:
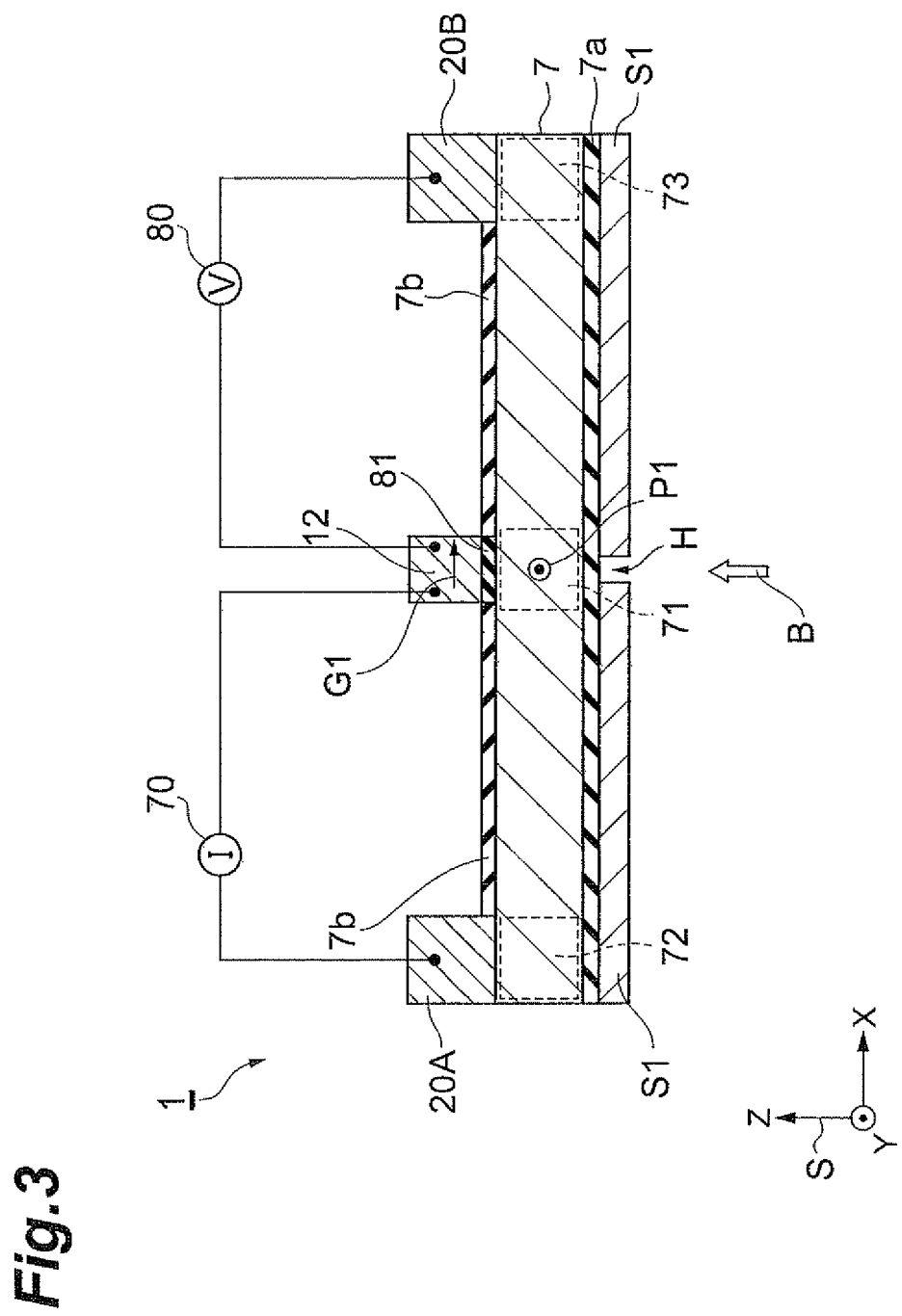
FIG. 3 is a side view for explaining effects of the magnetic sensor.

Operations and effects of the magnetic sensor 1 in accordance with this embodiment will now be explained. FIG. 3 is a side view for explaining operations of the magnetic sensor 1 in accordance with the first embodiment. To begin with, the direction of magnetization of the ferromagnetic layer 12 is pinned. The direction of magnetization G1 of the ferromagnetic layer 12 (along the X axis in the example illustrated in FIG. 3) is pinned nonparallel to the magnetic field direction of the external magnetic field B (the Z axis in the example illustrated in FIG. 3).

For example, connecting the ferromagnetic layer 12 and first reference electrode 20A to a current supply 70 can cause a detection current to flow through the ferromagnetic layer 12. When a current flows from the ferromagnetic layer 12, which is a ferromagnetic body, to the nonmagnetic channel layer 7 through the barrier layer 81, electrons having a spin oriented in the direction corresponding to the direction of magnetization G1 of the ferromagnetic layer 12 are injected into the channel layer 7. The injected spins accumulate within the channel layer 7.

Here, when no external magnetic field B is applied to the channel layer 7, i.e., when the external magnetic field B is zero, the spins of electrons within the channel layer 7 do not rotate. Therefore, the spins oriented in the preset direction of magnetization G1 of the ferromagnetic layer 12 are detected by the ferromagnetic layer 12. Hence, the resistance output or voltage output attains a local extreme value when the external magnetic field B is zero. The local extreme value may be a local maximum or local minimum depending on the direction of the current or magnetization. The output can be evaluated by an output meter such as a voltmeter 80 connected to the ferromagnetic layer 12 and second reference electrode 20B.

On the other hand, a case where the external magnetic field B is applied from the through-hole H to the channel layer 7 will now be considered. When the external magnetic field B is applied, the direction of spins injected into the channel layer 7 rotates about the axial direction of the external magnetic field B (the Z axis in the example illustrated in FIG. 3) (i.e., so-called Hanle effect). The example illustrated in FIG. 3 shows a state where the direction of spins P1 is oriented in the Y axis. The relative angle between the direction of thus rotated spins P1 and the preset direction of magnetization G1 of the ferromagnetic layer 12, i.e., spin of electrons, determines the voltage output and resistance output of the interface between the channel layer 7 and the ferromagnetic layer 12. When the external magnetic field B is applied, the direction of spins of the channel layer 7 rotates, thus failing to orient in the direction of magnetization G1 of the ferromagnetic layer 12. Therefore, the resistance output or voltage output becomes less than a local maximum when the external magnetic field B is applied in the case where the local maximum would be attained if the external magnetic field B were zero, and more than a local minimum when the external magnetic field B is applied in the case where the local minimum would be attained if the external magnetic field B were zero.

Hence, in the magnetic sensor 1, the output peak appears when the external magnetic field B is zero, and the output decreases as the external magnetic field B is increased or decreased. That is, the output varies depending on whether there is the external magnetic field B or not, whereby the magnetic sensor 1 in accordance with this embodiment can be used as a magnetic detection device.

Thus, using the through-hole H formed in the magnetic shield layer, minute magnetic fluxes corresponding to the size of the through-hole H can be detected. Here, the resolution is determined by the size of the through-hole H, whereby magnetic fluxes can be detected from small areas without finely dividing the size of the ferromagnetic layer 12. Therefore, the device resistance can also be inhibited from being increased by finely dividing the ferromagnetic layer 12.

While conventional magnetic sensors utilizing spins exhibit output peaks according to relative angles between the directions of magnetization of free and pinned magnetization layers when they are parallel or antiparallel to each other, the magnetic sensor of the present invention yields the output peak when the external magnetic field is zero as mentioned above. When reading a positive/negative timing of the external magnetic field by employing the magnetic sensor of the present invention in a magnetic head or the like, for example, the output peak appears at a zero point where magnetic fields of a magnetic domain wall cancel each other out, whereby it can be determined that inversion has occurred there. The magnetic sensor of the present invention is also characterized by its lack of hysteresis.

Though a preferred embodiment of the present invention has been explained in detail in the foregoing, the present invention is not limited thereto. For example, the through-hole H is not restricted to the form mentioned above. FIG. 4(c) is a top plan view illustrating a mode of the through-hole in the magnetic shield layer S. FIG. 4(d) is a sectional view taken along the line D-D of FIG. 4(c). As illustrated in FIG. 4(c), the bottom part h1 of the through-hole H may have a diameter smaller than that of the top part h2 of the through-hole H. That is, the through-hole H may have a tapered side face. In this case, magnetic fluxes caused by the external magnetic field B cannot be absorbed by the magnetic shield layer S when obliquely incident on the upper face of the channel layer 7. Therefore, the angle of incidence of the external magnetic field B can be changed according to the taper angle θ.

Figure 5:
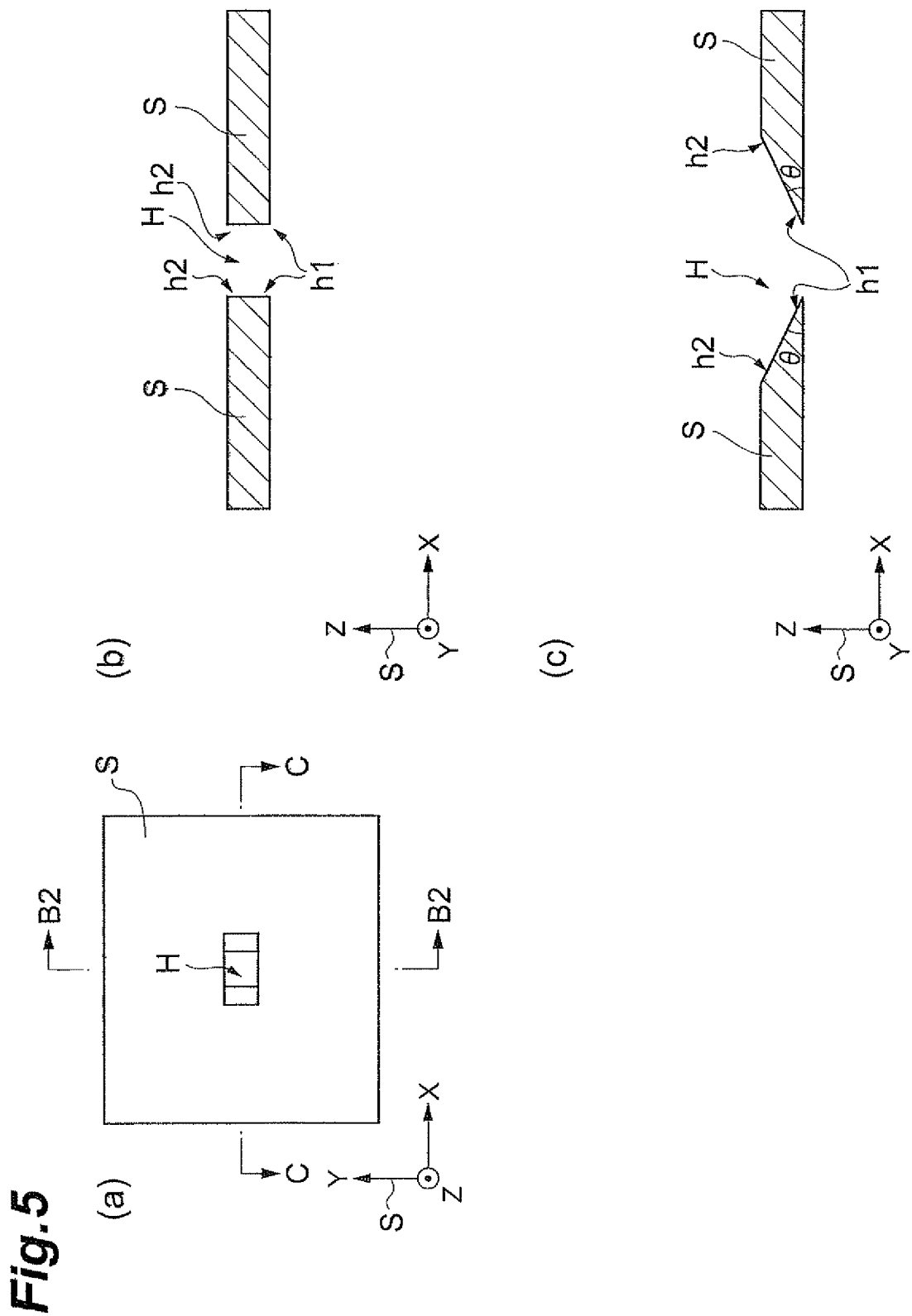
FIG. 5(a) is a top plan view illustrating an example of the through-hole formed in the magnetic shield layer.
FIG. 5(b) is a sectional view taken along the line B2-B2 of FIG. 5(a)
FIG. 5(c) is a sectional view taken along the line C-C of FIG. 5(a)

FIG. 5(a) is a top plan view illustrating a mode of the through-hole in the magnetic shield layer S. FIG. 5(b) is a sectional view taken along the line B2-B2 of FIG. 5(a). FIG. 5(c) is a sectional view taken along the line C-C of FIG. 5(a). As illustrated in FIG. 5(a), when the through-hole H has a rectangular form as seen from the thickness direction of the magnetic shield layer S (the Z axis), its shorter sides may be provided with tapered side faces while keeping the longer sides free of tapered side faces. That is, as illustrated in FIG. 5(b), the bottom part h1 may have the same diameter as with the top part h2 in the longer-side direction of the through-hole H. In the shorter-side direction of the through-hole H, on the other hand, the bottom part h1 of the through-hole H may have a diameter smaller than that of the top part h2 of the through-hole H as illustrated in FIG. 5(c). This can also change the angle of incidence of the external magnetic field B according to the taper angle θ.

Figure 6:
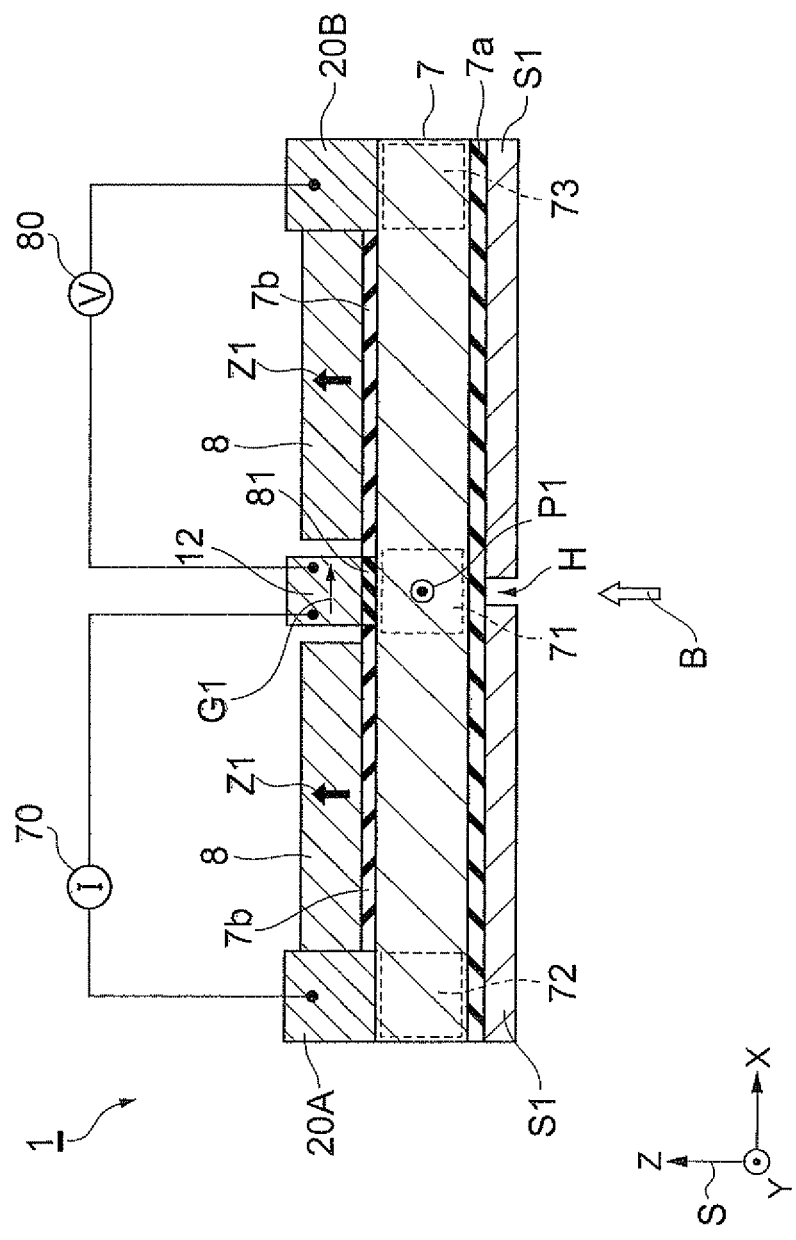
FIG. 6 is a top plan view illustrating an example of the magnetic sensor equipped with a permanent magnet.

Preferably, the magnetic sensor further comprises a permanent magnet for supplying the through-hole H with a magnetic field oriented in the axial direction of the through-hole H. FIG. 6 is a top plan view illustrating an example in which the magnetic sensor is equipped with a permanent magnet. The magnetic sensor 1 illustrated in FIG. 6 further comprises a permanent magnet 8 on the insulating film 7b formed on the upper face of the channel layer 7. The permanent magnet 8 is adapted to generate a magnetic field Z1 oriented in the axial direction of the through-hole H (±Z directions in the example of FIG. 6) and applies a magnetic field oriented in the axial direction of the through-hole H (±Z directions) to the first region 71 of the channel layer 7. While an output peak appears when the external magnetic field B to be detected is zero in the case where no magnetic field is applied to the channel layer 7 by the permanent magnet 8, the output peak can be issued when the external magnetic field B is not zero by applying a magnetic field to the channel layer 7 with the permanent magnet 8. As illustrated in FIG. 6, the ferromagnetic layer 12 and the permanent magnet 8 are arranged with a gap therebetween in order to prevent them from magnetically coupling with each other. Alternatively, an insulating film may be provided between the ferromagnetic layer 12 and the permanent magnet 8.

Figure 7:
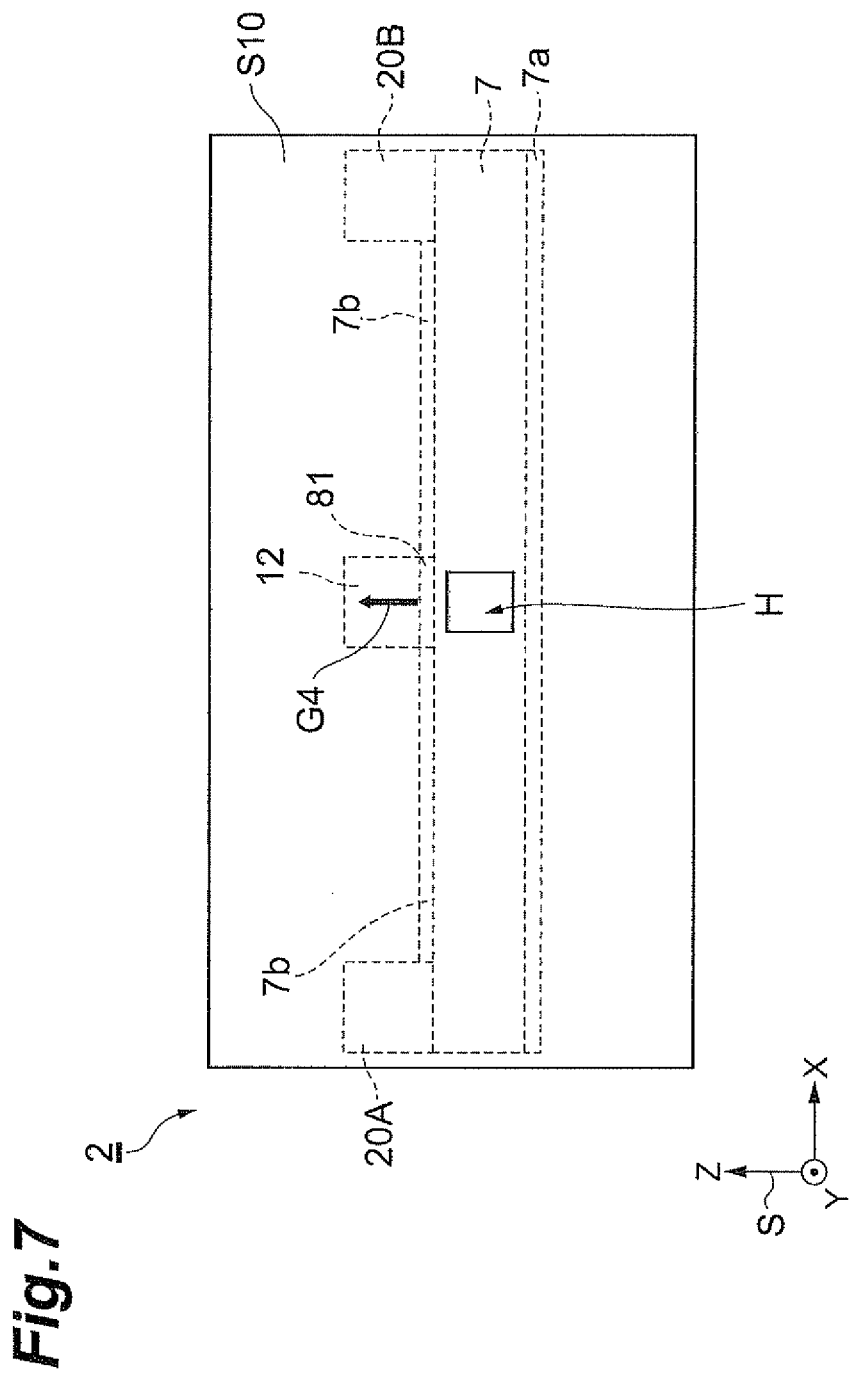
FIG. 7 is a side view illustrating Modified Example 1 of the magnetic sensor.

The through-hole H may be formed in a side magnetic shield layer covering a side face of the channel layer 7, for example. FIG. 7 is a side view illustrating Modified Example 1 of the magnetic sensor. In the magnetic sensor 2 illustrated in FIG. 7, the through-hole H is formed in a side magnetic shield layer S10. This magnetic sensor 2 detects external magnetic fields along the Y axis. The through-hole H is arranged such as to oppose a side face of the channel layer 7 existing in the region under the ferromagnetic layer 12. That is, when the through-hole H is formed in the side magnetic shield layer S, no through-hole is formed in the lower magnetic shield layer. As a consequence, external magnetic fields can be read from the side face of the channel layer 7. It will be preferred if the direction of magnetization G4 of the ferromagnetic layer 12 (the Z axis in the example of FIG. 7) is nonparallel to the direction of magnetization of the applied external magnetic field (e.g., the Y axis) in this case as well.

Figure 8:
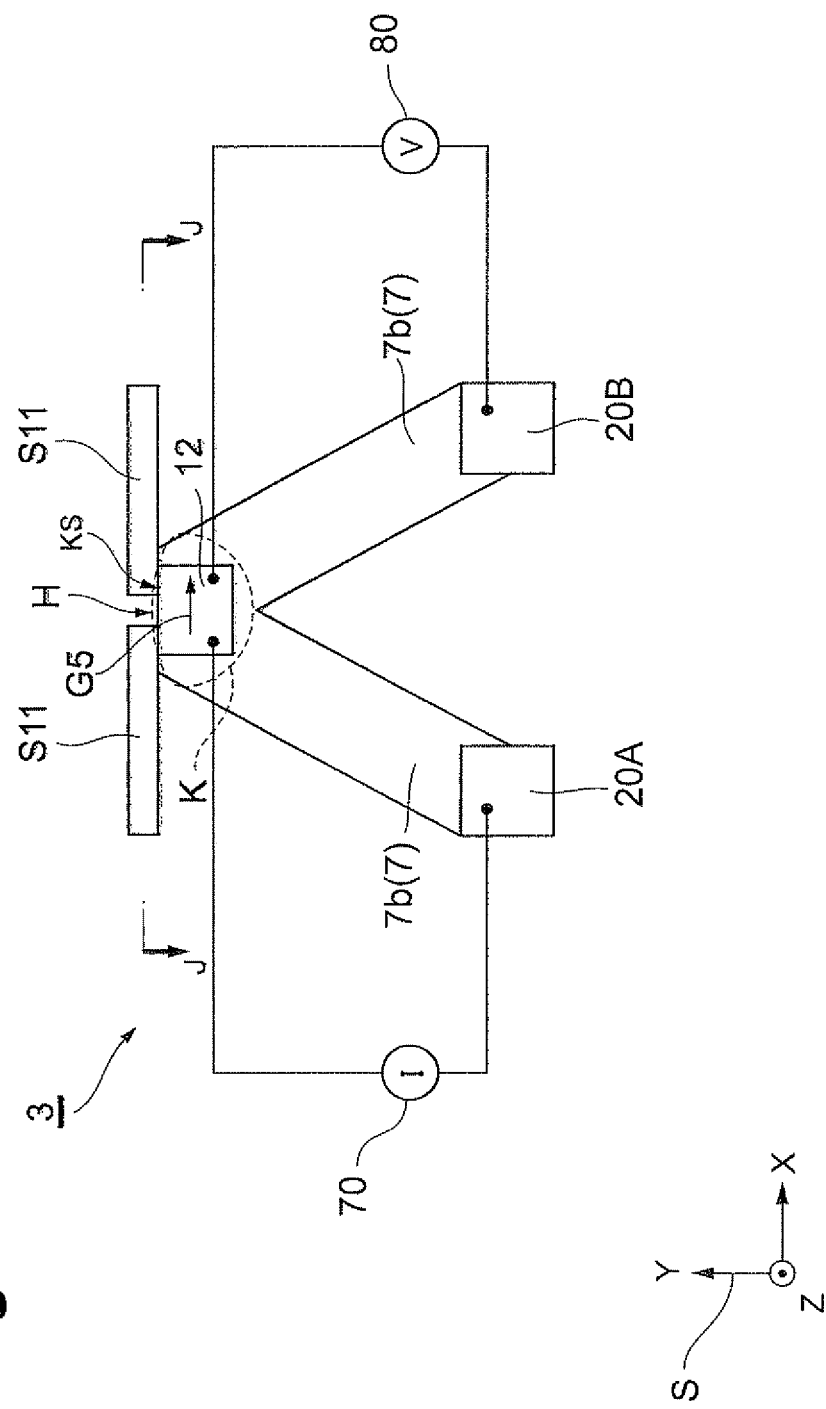
FIG. 8 is a side view illustrating Modified Example 2 of the magnetic sensor.
Figure 9:
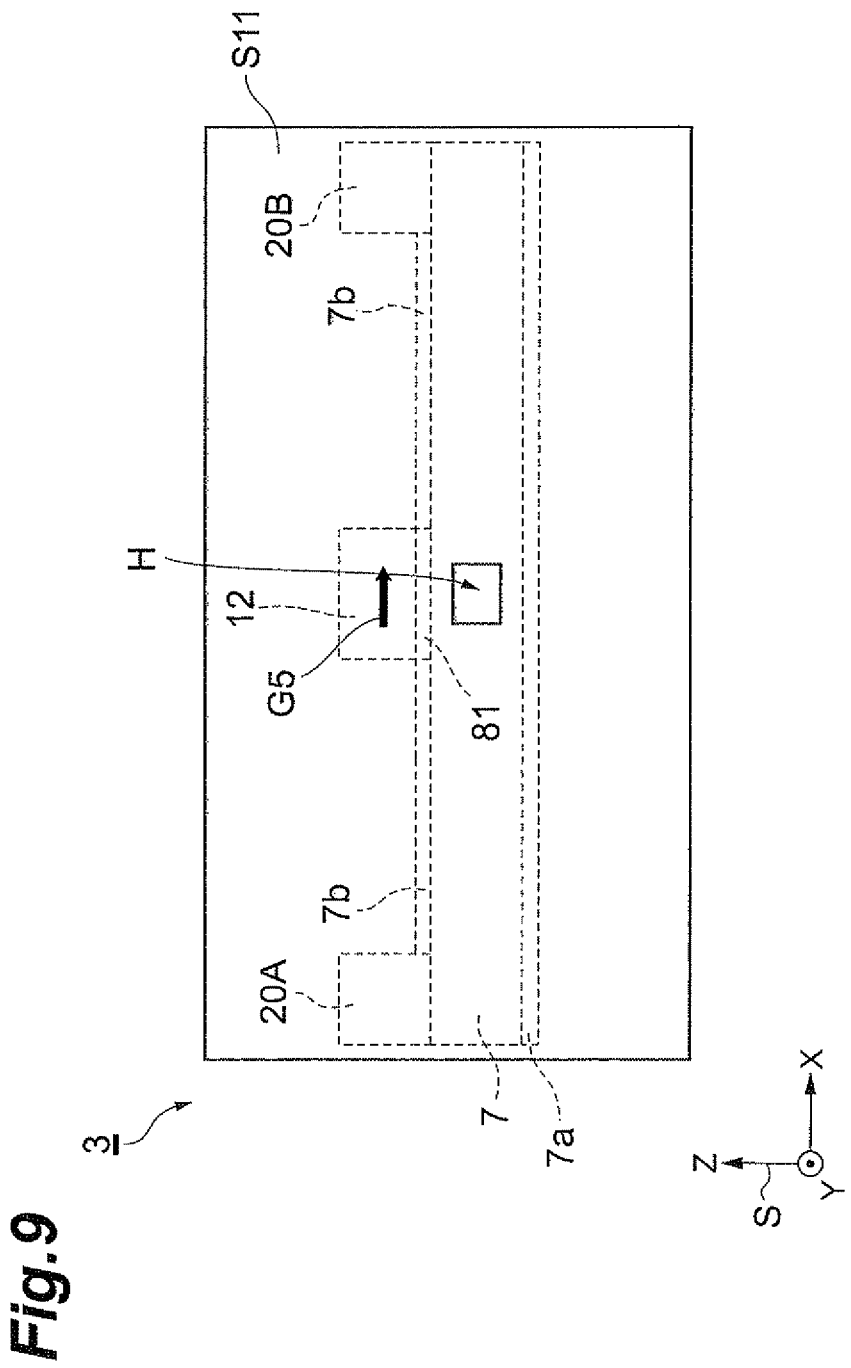
FIG. 9 is a side view illustrating a cross section taken along the line J-J of FIG. 8.

The channel layer 7 may have a form other than rectangles when seen from the thickness direction. FIG. 8 is a top plan view illustrating Modified Example 2 of the magnetic sensor. FIG. 9 is a side view illustrating a cross section taken along the line of FIG. 8. In the magnetic sensor 3 illustrated in FIG. 8, the channel layer 7 has a bent form as seen from the thickness direction of the channel layer 7 (the Z axis). The magnetic sensor 3 illustrated in FIG. 8 detects external magnetic fields along the Y axis. The channel layer 7 is disposed under the insulating film 7b and thus is not depicted in FIG. 8. In this case, the through-hole H is arranged such as to oppose an outer side face KS of a bend K of the channel layer 7 having the bent form. In the example illustrated in FIGS. 8 and 9, the through-hole H is provided in a side magnetic shield layer S11 covering a side face of the channel layer 7. Thus bending the channel layer 7 and arranging the through-hole H such as to make it oppose the outer side face KS of the bend K allows a region for reading magnetic fluxes of the external magnetic field B and the like to be made compact.

Preferably, as illustrated in FIG. 8, the outer side face KS of the bend K of the channel layer 7 is made flat, and the side magnetic shield layer S11 is formed along the outer side face KS. In this case, the surface for reading external magnetic fields is flat, so that magnetic fields can easily be detected when this flat surface KS opposes a surface to be read of a recording medium, for example. FIGS. 8 and 9 illustrate an example in which the direction of magnetization G5 of the ferromagnetic layer 12 is pinned to the X axis. In this case, external magnetic fields can be applied from the Y axis, for example. The permanent magnet 8 may further be arranged such as to oppose the upper and lower faces of the bend K of the channel layer 7, thereby feeding the through-hole H with a magnetic field oriented in the Y axis.

Figure 10:
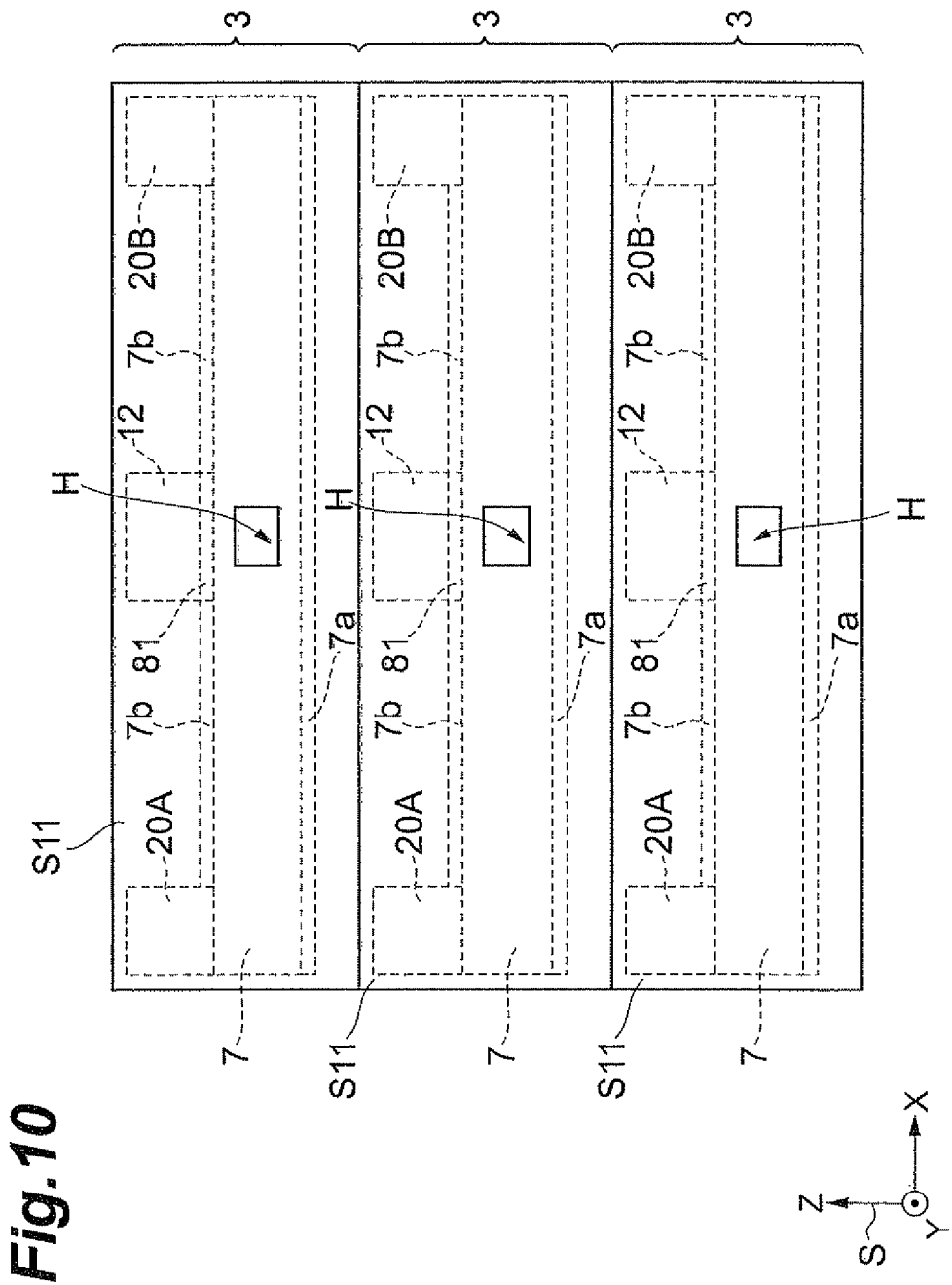
FIG. 10 is a side view illustrating Modified Example 3 of the magnetic sensor.

A magnetic detector may comprise a plurality of such magnetic sensors. In this case, respective outputs of the magnetic sensors can be combined. Such a magnetic detector can be employed in a biosensor for detecting cancer cells and the like, for example. For instance, a plurality of such magnetic sensors may be arranged in parallel or laminated, so as to form a magnetic detector. FIG. 10 is a side view illustrating Modified Example 3 of the magnetic sensor. As an example, FIG. 10 illustrates a structure in which a plurality of magnetic sensors 3 each depicted in FIG. 9 are laminated.

Preferably, the magnetic field for pinning the direction of magnetization of the ferromagnetic layer 12 is greater than the external magnetic field B to be evaluated. This allows the external magnetic field B to be detected stably.

The above-mentioned magnetic sensor can be employed in a reading head part in a magnetic head equipped with a recording head part for writing, for example. This makes it possible to provide a magnetic head which can detect magnetic fluxes from minute areas of recording media and the like, for example.

The current supply 70 and the output meter (e.g., voltmeter 80) may exchange their places. That is, the ferromagnetic layer 12 and first reference electrode 20A may be connected to the output meter, while making the ferromagnetic layer 12 and second reference electrode 20B connect with the current supply 70. In this case, the ferromagnetic layer 12 functions as receiving and injecting electrodes.

The foregoing illustrates an example in which the barrier layer 81 is a tunnel barrier made of an insulating film. However, the barrier layer 81 may be a tunnel barrier made of a metal film. In this case, it may constitute a Schottky barrier between the semiconductor channel layer 7 and the metal barrier layer 81.

The direction of magnetization of the ferromagnetic layer 12 may be pinned by an antiferromagnetic body disposed on the ferromagnetic layer 12. For example, the above-mentioned magnetic sensor may further comprise an antiferromagnetic layer, disposed on the ferromagnetic layer 12, for pinning the direction of magnetization. This can yield the ferromagnetic layer 12 having a higher coercive force in one direction than when no antiferromagnetic layer is provided.

As mentioned above, when the external magnetic field B is applied to the channel layer 7 from the through-hole H, the direction of spins injected into the channel layer 7 rotates about the axis of the applied magnetic field. If the axial direction of the through-hole is parallel to the direction of magnetization of the ferromagnetic layer, no rotation will occur in the direction of spins in response to the external magnetic field applied, thus making it hard to detect magnetic fluxes. Hence, such magnetic fluxes can be detected favorably when the axial direction of the through-hole H is nonparallel to the direction of magnetization of the ferromagnetic layer 12.

The direction of magnetization of the ferromagnetic layer 12 may be parallel to its surface opposing the channel layer 7 as in FIG. 3 or 8 or perpendicular thereto as in FIG. 7.

Since the half width of the peak of voltage output or resistance output with respect to the external magnetic field is in proportion to the reciprocal of the spin life in the channel layer 7, the magnetic field sensitivity becomes better as the spin life is longer. Examples of materials having a long spin life usable in the channel layer 7 include Si and GaAs, in which Si is preferred in particular. Though the magnetic field sensitivity becomes inferior, a wider range of magnetic fields can be detected when the spin life in the channel layer 7 is shorter.

While the foregoing is explained with reference to examples in which the channel layer 7, ferromagnetic layer 12, and magnetic shield layer are so-called layers, the present invention is not limited thereto. Various modes of channels, ferromagnetic bodies, and magnetic shields can replace the channel layer 7, ferromagnetic layer 12, and magnetic shield layer as long as they are usable as constituents for the above-mentioned magnetic sensor. In this case, each of the channel, ferromagnetic body, and magnetic shield may be made spherical or circular cylindrical, for example.

Reference Signs List 1, 2, 3 ... magnetic sensor; 7 ... channel layer; 7a, 7b ... insulating film; 8 ... permanent magnet; 12 ... ferromagnetic layer; 20A ... first reference electrode; 20B ... second reference electrode; S1 ... lower magnetic shield layer; S10, S11 ... side magnetic shield layer; H ... through-hole; 81 ... barrier layer; K ... bend

What is claimed is:
1. A magnetic sensor comprising:
a channel;
a ferromagnetic body and first and second reference electrodes on the channel;
a magnetic shield covering a part of the channel opposing the ferromagnetic body; and an insulating film disposed between the channel and the magnetic shield;

wherein the magnetic shield has a through-hole extending toward the part of the channel opposing the ferromagnetic body, and wherein an axial direction of the through-hole is nonparallel to a direction of net magnetization of the ferromagnetic body.

2. A magnetic sensor according to claim 1, wherein the through-hole has a whole cross section opposing the channel as seen from an axial direction of the through-hole.

3. A magnetic sensor according to claim 1, wherein the through-hole has a bottom part having a size smaller than that of a top part thereof.

4. A magnetic sensor according to claim 1, wherein the channel has a bent form; and wherein the through-hole is disposed so as to oppose an outer side face of a bend of the channel.

5. A magnetic sensor according to claim 1, wherein the ferromagnetic body has a direction of magnetization pinned by an antiferromagnetic body disposed on the ferromagnetic body.

6. A magnetic sensor according to claim 1, further comprising a permanent magnet for supplying the through-hole with a magnetic field oriented in an axial direction of the through-hole.

7. A magnetic sensor according to claim 1, wherein the ferromagnetic body is made of a metal selected from the group consisting of Cr, Mn, Co, Fe, and Ni, an alloy containing at least one element selected from the group, or a compound containing at least one element selected from the group and at least one element selected from the group consisting of B, C, N, Si, and Ge.

8. A magnetic sensor according to claim 1, wherein the channel is made of a semiconductor containing at least one of Si, Ge, GaAs, C, and ZnO.

9. A magnetic sensor according to claim 1, wherein a barrier layer is formed between the ferromagnetic body and the channel.

10. A magnetic detector comprising a plurality of magnetic sensors according to claim 1.

11. A magnetic head comprising a reading head part having the magnetic sensor according to claim 1 and a recording head part for writing.

* * * * *